United States Patent [19]

Kaae et al.

[11] Patent Number: 4,486,473
[45] Date of Patent: Dec. 4, 1984

[54] METHOD AND APPARATUS FOR COATING FRAGILE ARTICLES IN A FLUIDIZED BED OF PARTICLES USING CHEMICAL VAPOR DEPOSITION

[75] Inventors: James L. Kaae, Solana Beach; Terry D. Gulden; Ling Yang, both of La Jolla, all of Calif.

[73] Assignee: GA Technologies Inc., San Diego, Calif.

[21] Appl. No.: 534,369

[22] Filed: Sep. 21, 1983

[51] Int. Cl.³ .............................................. C23C 11/00
[52] U.S. Cl. .................................. 427/249; 427/248.1; 427/255.6; 118/715; 118/DIG. 5
[58] Field of Search ............ 427/185, 181, 249, 255.7, 427/248.1; 118/717, 715, DIG. 5; 422/139, 143, 146

[56] References Cited

U.S. PATENT DOCUMENTS

| | | | |
|---|---|---|---|
| 3,138,435 | 6/1964 | Diefendorf | 264/81 |
| 3,197,328 | 7/1965 | Jung et al. | 118/717 |
| 3,382,093 | 5/1965 | Nack | 118/24 |
| 3,399,969 | 9/1968 | Bokros et al. | 264/81 |
| 3,593,678 | 7/1971 | Miller | 118/630 |
| 3,834,927 | 9/1974 | Putney | 427/185 |

FOREIGN PATENT DOCUMENTS 573203 9/1977 U.S.S.R. ...................... 118/DIG. 5

Primary Examiner—Norman Morgenstern
Assistant Examiner—Robert J. Steinberger, Jr.
Attorney, Agent, or Firm—Fitch, Even, Tabin & Flannery

[57] ABSTRACT

A massive article is coated by chemical vapor deposition in a chamber having a horizontal cross-sectional configuration generally matched to the horizontal cross-sectional configuration of the article. For an article which is relatively thin between a pair of opposed faces so that the article is subject to breakage by the force of surging particles of a fluidized particle bed, breakage is reduced in a coating chamber having vertical sidewalls that generally parallel the faces of the article and relatively narrow endwalls. The article is centered in the chamber with its faces parallel to the sidewalls leaving a region between the faces that accommodates an adequate flow of carrier gas and coating vapor without requiring a large charge of particles that would create undue surging force against the article.

8 Claims, 10 Drawing Figures

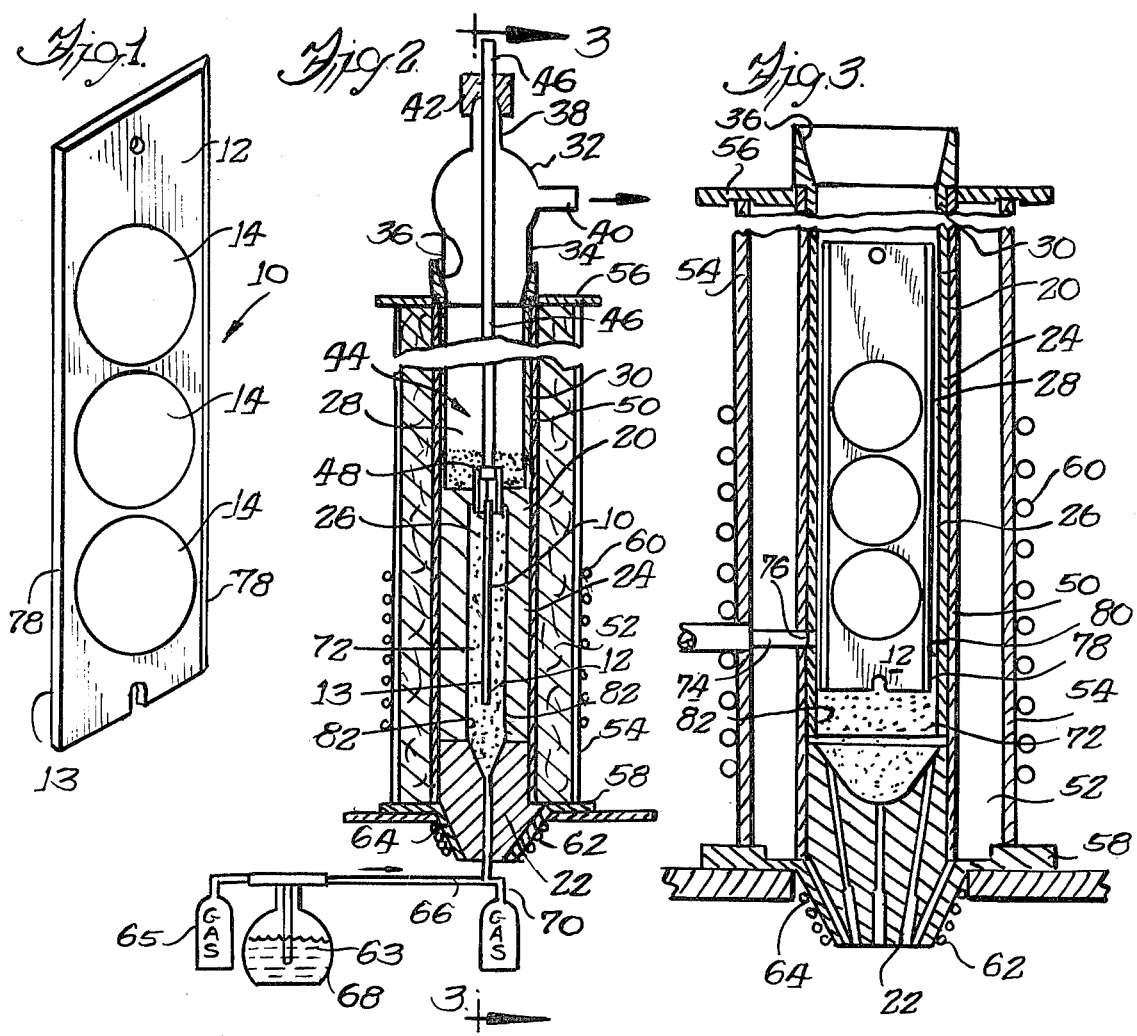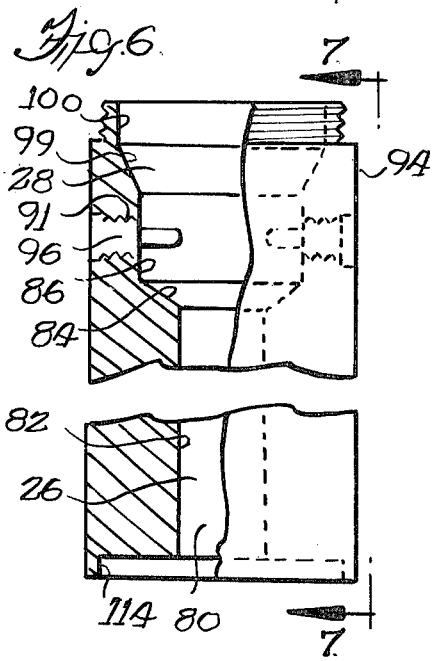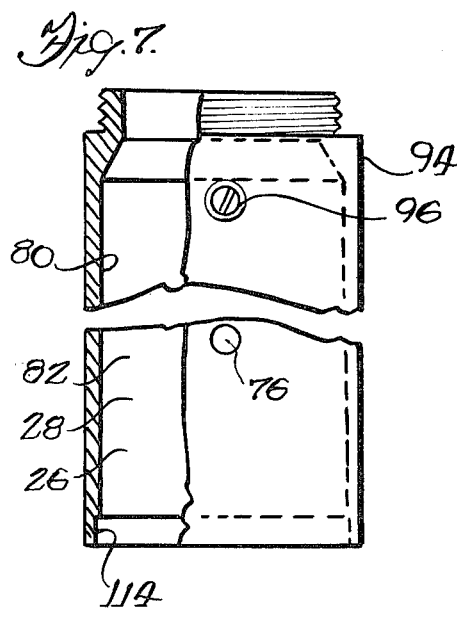

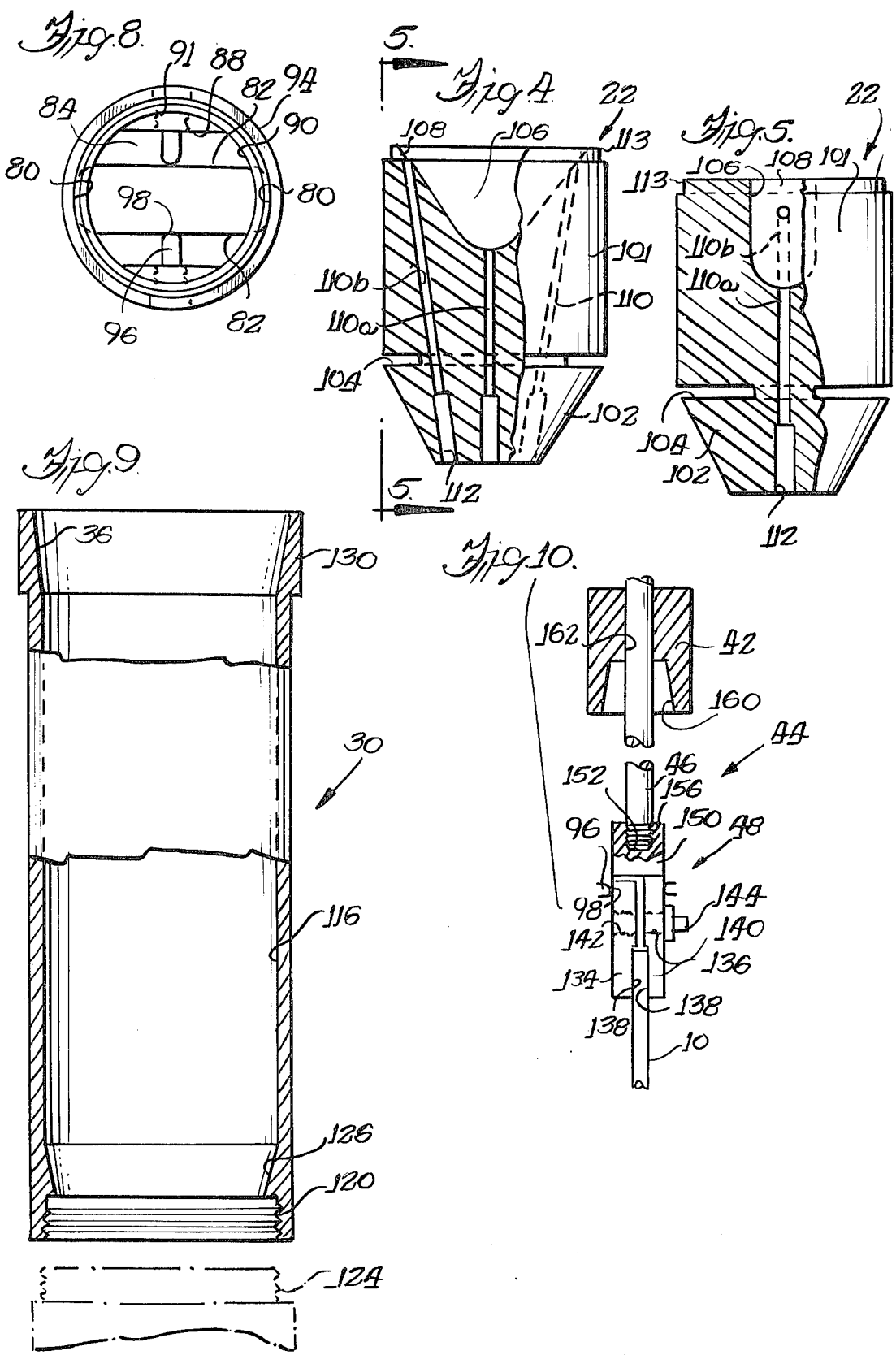

METHOD AND APPARATUS FOR COATING FRAGILE ARTICLES IN A FLUIDIZED BED OF PARTICLES USING CHEMICAL VAPOR DEPOSITION

The present invention relates to methods and apparatus for depositing materials on surfaces and more particularly to methods and apparatus for forming coatings on articles through chemical vapor deposition in a fluidized bed of particles.

BACKGROUND OF THE INVENTION

Chemical vapor deposition relates to the process of chemically reacting or decomposing a compound or compounds at elevated temperatures to deposit decomposition products on surfaces of particles or large objects. Pyrolytic carbon may be deposited on a surface by thermally decomposing gaseous hydrocarbons or vapors of other carbon-containing substances. Metal carbides may be deposited on a surface by thermally decomposing a mixture of vaporized metallic halides and vaporized hydrocarbon or by decomposing a metal-containing organic compound. Silicon carbide may be deposited on a surface by decomposing an organic silicon compound, such as methyl trichlorosilane.

Chemical vapor deposition is frequently used to coat relatively small particles, such as nuclear fuel particles, and is also used to coat massive substrates producing composite articles in which the substrate is protected by the deposited coating. In some instances, a mandrel may be coated, and the coating later removed from the mandrel to serve as the end product.

It has been found that the crystalline structure and the density of coatings are dependent on several, independently variable operating conditions of the coating apparatus employed. Among the factors influencing crystalline structure and density are the ratio of the total surface area within the chamber to the free volume within the chamber. If small particles are being coated, the surface to volume ratio may be adjusted according to the total amount of the particulate material supplied to the chamber.

Large articles have very small surface areas relative to the surface area of an equal mass of tiny particles, and the article itself may not have sufficient surface area to provide an optimal surface area to volume ratio within the coating chamber. To adjust the surface area to volume ratio within a chamber in which a large article is coated, it is known to include within the coating chamber particulate material that is fluidized by the flowing gases.

Problems have developed in attempts to coat certain large articles in a chamber together with a fluidized particle bed. In particular, broad, thin articles may be broken by particle surging forces. Certain proposed solutions to such a problem, such as reducing the rate of gas flow through the coating chamber, may not be consistent with achieving the desired density and crystalline structure of the coating.

One attempted solution to the problem of article breakage was to support the suspended article at several points; however, this solution would be unsatisfactory for many coating applications because, wherever the article is supported, coating does not occur. Furthermore, fixtures for supporting articles at multiple points are complex, and the fixtures are themselves subject to breakage by surging particles.

SUMMARY OF THE INVENTION

Coating apparatus is provided having a chamber with a cross section contoured to match the cross section of the article to be coated allowing a gap between the article and the chamber for particle movement but not allowing the gap to be so large that the article is subject to breakage. Carrier gas and coating vapor flow upwardly through the chamber fluidizing the particulate material that is added to the chamber for the purpose of increasing the surface area to volume ratio within the chamber. The article is suspended vertically within the chamber, and breakage of the article by potential surging forces of the particulate material is minimized by the configuration of the chamber. Thus, to coat an article having a generally rectangular horizontal cross section, a chamber having a generally rectangular horizontal cross section is provided. This also has the effect of reducing the bed surface area over that in a conventional cylindrical coater, thereby substantially increasing the effective coating efficiency on the large object.

BRIEF DESCRIPTION OF THE DRAWINGS

FIG. 1 is a perspective view of a susceptor plate which is to be coated using chemical vapor deposition and the methods and apparatus of the present invention;

FIG. 2 is a diagrammatic view of apparatus embodying various features of the invention for coating large objects by chemical vapor deposition;

FIG. 3 is an enlarged diagrammatic view of the apparatus taken along line 3—3 of FIG. 2;

FIG. 4 is an elevation view, partially cut away, of a lower segment of the core of the apparatus of FIGS. 2 and 3, which lower core segment serves as a gas inlet for the coating chamber;

FIG. 5 is a view similar to FIG. 4 taken along line 5—5 of FIG. 4;

FIG. 6 is an elevation view, partially cut away, of the central segment of the core of the apparatus of FIGS. 2 and 3, which central segment provides the chamber portion wherein a broad flat object is coated;

FIG. 7 is a view similar to FIG. 6 taken along line 7—7;

FIG. 8 is a plan view of the central core segment of FIGS. 6 and 7;

FIG. 9 is an elevation view, partially cut away, of the upper core segment of FIGS. 2 and 3, which upper segment serves as a gas exhaust chimney; and FIG. 10 is an elevation view of a clamping assembly for locating the object to be coated within the chamber.

DETAILED DESCRIPTION OF A PREFERRED EMBODIMENT

Illustrated in FIG. 1 is a susceptor plate 10 for use in processing silicon wafers used in the electronics industry. This plate is coated by chemical vapor deposition in a fluidized bed of particles using the methods and apparatus of the present invention. The invention will be discussed primarily in terms of coating the susceptor plate 10 because the invention was developed to overcome a substantial amount of breakage incurred in attempting to coat such plates. However, other thin, articles, such as fusion limiter tiles, or parts for jet engine augmentors may also be coated by the methods and apparatus of the present invention.

Susceptor plates 10 are roughly thin, flat sheets of material machined from graphite. A typical susceptor plate has dimensions of about 0.6 cm × 8.3 cm × 38.7 cm.

Machined into a top face 12 of the susceptor plate are circular depressions 14 in which silicon is deposited on circular silicon wafers. It is desirable to coat the susceptor plate with carbon, silicon carbide or mixtures thereof because the graphite of which the plates are formed frequently contains substantial amounts of impurities and is porous. Impurities may be incorporated into the deposited silicon and thereby degrade the electronic properties of the wafer. In addition, impurities trapped in the porous graphite slowly outgas making it difficult to obtain the high vacuum desired for silicon deposition, which substantially extends the processing time of the wafers. A chemically vapor deposited coating seals in the impurities and is impervious.

It was initially attempted to coat a susceptor plate suspended vertically within a coater with a conventional design having a circular cross section. Unfortunately, under conditions which were considered desirable for providing the best coating structure, the surging particles of the fluidized bed caused considerable breakage of susceptor plates. It was found that breakage could be reduced if the susceptor plate were supported from several places, but of course, wherever the plate was supported, coating did not occur. A solution to the breakage problem, described herein, was reached by redesigning the coating chamber to match the configuration of the article being coated.

Illustrated in FIGS. 2 and 3 is apparatus for coating a susceptor plate 10 or other flat fragile article. At the axial center of the apparatus are component segments that are individually machined from graphite and together provide a coating chamber core 20, including a lower graphite core segment that serves as a gas inlet 22, a central graphite core segment 24, providing a region 26 of a coating chamber 28 in which the susceptor plate 10 is suspended and pyrolytically coated, and an upper graphite segment providing a cooling chimney 30 for the flowing gases.

At the top of the apparatus is a generally spherical glass chamber 32 which includes a downwardly extending open arm 34 which mates with an upper opening 36 at the top of the chimney 30, an open upper arm 38 and a side exhaust arm 40 connectable to an exhaust conduit (not shown). A graphite fitting 42, which mates with and closes off the upper arm 38, supports a clamping assembly 44 (FIG. 10), including an elongated graphite rod 46 that extends down through the glass chamber 32 and the chimney 30 to the upper end of the central graphite core segment 24. Attached to the lower end of the graphite rod 46 is a graphite clamp 48 that holds the plate 10, by its upper end, suspended in a vertical plane within the coating chamber region 26.

Immediately outward of the graphite core 20 is a tubular graphite liner 50, and surrounding the liner is insulating material 52, such as graphite felt. An outer quartz shell 54 along with an upper cap 56 and a lower cap 58 provide a region that is filled with an inert (to graphite) gas to protect the graphite core 20 from burning at the high operation temperatures, i.e., upwards of 1300° C., required for chemical vapor deposition of carbon or silicon carbide.

For small coating chambers, such as that illustrated, the graphite core 20 is preferably heated inductively by means of electrical coils 60 that surround the quartz shell 54. Water cooling coils 62, disposed around a frustoconical portion 64 of the lower cap 58 that holds the inlet 22, cool the lower end of the inlet relative to the central core segment 24, minimizing decomposition of coating vapor within the inlet itself.

A gas, such as $H_2$ from a source 65, carries vapors of a coating substance 63 to the chamber 28 through line 66. When the coating substance 63 is a liquid at room temperature, the carrier gas is bubbled through a container 68 of the liquid, becoming substantially saturated with vapor of the substance. Additional carrier gas from line 70 is mixed into the gas stream to provide a proper carrier gas to coating vapor partial pressure ratio. The gas stream flows upwardly through the chamber 28 at a rate sufficient to fluidize a bed of particulate material 72, at least upward to a level above the upper end of the suspended susceptor plate 10.

For the purpose of measuring the temperature of the core 20 around the coating chamber 28, a sight port 74 extends through the quartz outer shell 54, the insulating material 52, the graphite liner 50 and into a closed end bore 76 of the central graphite core segment 24, terminating just short of the chamber portion 26. At the chemical vapor deposition temperatures, the heat causes the graphite core 20 to glow white hot, and the temperature of the central core segment 24 is determined by the spectrum of the glow emitted through the sight port 74.

In accordance with the present invention, for coating a relatively thin article 10 having a pair of opposed faces 12, 13 and a thickness between the opposed faces such that the article is subject to breakage by the force of surging particles, the region 26 of the coating chamber 28 where the article is suspended for coating, has a pair of opposed vertical sidewalls 82 spaced generally parallel to each other so that when the article is centered in the chamber 28 between the walls, the faces of the article are generally spaced equidistantly therefrom. In the case of an article, such as a susceptor plate 10, having a generally rectangular horizontal cross section, the actual coating region 26 of the chamber 28 preferably has a rectangular horizontal cross section. Matching the sidewalls 82 of the coating chamber 28 to the faces 12, 13 of the article 10 reduces the amount of particulate material 72 required to form the fluidized bed and therefore reduces particle surge forces against the article. Reduction of the required amount of coating charge 72 also permits a corresponding reduction in both carrier gas and coating gas, and reductions of all of these contribute to a less expensive coating process.

So that the invention will be more fully understood, a preferred embodiment of the graphite segments which form the core 20 and a preferred embodiment of the clamping assembly 44 by which the susceptor plate 10 is suspended will now be described in greater detail.

The central core segment 24, which provides the actual rectangular cross-sectional coating region 26, is machined from a unitary block of graphite and has an exterior that is configured generally as a right circular cylinder. From closely adjacent to the lower end to near the top end of the central segment 24, the coating chamber region 26 has a uniform cross section that is rectangular except for rounded corners. As best seen in FIG. 3, the susceptor plate 10 is received in this region with its lateral edges 78 closely adjacent to the narrower endwalls 80 of the chamber 28 while the generally flat faces 12, 13 of the plate are centered between the longer sidewalls 82 of the chamber. For coating an article having a width considerably greater than its thickness, the volume of the rectangular coating chamber region 26 having endwalls 80 considerably narrower than sidewalls 82 is reduced considerably relative to the volume of a circular chamber that would be needed to accommodate the same article, i.e., a circular chamber having a diameter equal to the horizontal dimension of the flat sidewalls. It is preferred that the volume of the coating chamber region 26 be reduced by at least about half relative to a cylindrical coating chamber and preferably by at least about two-thirds. To achieve this reduction in volume, the horizontal dimension of the sidewalls 82 are preferably between about ⅜ and about ¼ times the horizontal dimension of the endwalls 80.

It is important that the susceptor plate 10 not touch the chamber sides while it is suspended for coating because contact of the plate with the sides will lead to abrasion at the contact points, and the spacing at the edges is sufficient to prevent this from happening. For example, for a plate having cross-sectional dimensions of 0.6 cm × 8.3 cm, a suitable cross-sectional dimensions of the region 26 is 3.8 cm × 10.7 cm. Preferably, the spacing of lateral edges 78 of a flat article from the endwalls is between about 1 cm and about 5 cm. Preferably, the spacing of the flat faces 12, 13 of the article from the sidewalls 82 is between about 1 and about 5 cm, which spacing provides for adequate gas flow along the faces 12, 13 of the article. Preferably, to provide a sufficient region for gas flow and the fluidized bed without subjecting the plate 10 to excessive particle surge forces, the horizontal cross-sectional area of the coating region 26 is between about 5 and about 10 times the horizontal cross-sectional area of the plate.

Toward the upper end of the central core segment 24, the interior surface tapers outward at 84 (FIG. 6) to a broader region 86 having a cross section with opposed flat sidewalls 88 (FIG. 8) and opposed arcuate endwalls 90. Extending from the exterior 94 of the segment 24 through the opposed flat interior sides 88 are threaded bores 91 which receive threaded bolts 96 having rounded tips 98. These bolts 96 are tightened so that their rounded tips 98 press against the clamp 48, restraining it firmly centered relative to the rectangular cross-sectional coating region 26 therebelow. Upward of the broader region 86, the interior tapers outward again at 99 to a circular region 100.

The gas inlet 22 is also machined from a unitary piece of graphite. Its exterior configuration at an upper portion 101 is generally that of a right circular cylinder. A lower portion 102, which is water cooled by means of the coils 62, is frustoconical. At the junction of the cylindrical and frustoconical portions 101, 102, a deep groove 104 is formed to effect partial thermal separation between the cylindrical upper portion 101 and the water-cooled frustoconical lower portion 102.

In the upper end of the inlet 22 is formed the entrance region 106 of the coating chamber 28. The upper end 108 of this region 106 is matched in cross-sectional configuration (generally rectangular) to that of the coating chamber portion 26 of the central core segment 24, and downwards, the entrance region 106 flares outward from its narrow lower end as seen in FIG. 4.

To link the chamber 28 to the gas source 65, channels 110 extend from the lower end of the inlet 22 upwards to the entrance region 106. In the illustrated embodiment, three channels 110a,b are provided, the center one 110a opening to the vertex of the region 106 and the other two 110b opening to the region 106 along its endwalls. The side channels 110b diverge upward at a slight angle from the vertical central channel 110a, and at the lower end of each channel is a countersunk portion 112 for receiving a tapered connection fitting from the gas line 66. In larger apparatus, additional channels may be provided through the inlet to more evenly distribute the coating gases.

As a means of joining the inlet 22 to the central core section, the outside of the upper end 113 of the inlet is of slightly smaller diameter, and this reduced diameter upper end 113 is received in an interference fit within a countersunk region 114 at the lower end of the central core segment 24.

The upper segment or cooling chimney 30 (FIG. 9) is configured generally as a right circular tube, providing a cylindrical chamber region 116 above the induction coils 60 in which the heated gases cool slightly before being exhausted. The lower end of the chimney 30 has an interior thread 120 into which is screwed an exterior thread 124 at the upper end of the central core segment 24. Above the thread 120, the interior of the chimney 30 tapers outward at 126, slightly broadening the chamber region 116 extending through the chimney 30. An upper end 130 of the chimney has a slightly broader exterior, providing room for an internal taper at the opening 36 that receives the ground glass lower arm 34 of the glass exhaust chamber 32.

The members of the clamping assembly 44 are each machined from graphite in order to withstand the coating temperatures within the chamber 28. The clamp 48 itself consists of a pair of rectangular blocks 134, 136 between which is sandwiched the end of the susceptor plate 10 that is positioned upward within the chamber. The lower end of each block 134, 136 has a recess 138 in its facing surface which accommodates an upper end portion of the susceptor plate 10. To adjust the spacing between the blocks, one block 136 has a bore 140, the other 134 has an aligned threaded bore 142, and a graphite bolt 144 extends from the outside of one block 136 and into the threaded bore 142 of the other 134, the blocks gripping the plate as a result of rotation of the bolt 144.

As a means of attaching the clamp 48 to the rod 46 that extends down through the glass chamber 32 and chimney 30, one of the facing blocks 136 has an integral lug 150 at its upper end which overhangs the other block 134. A threaded closed end bore 152 in the lug 150 receives an externally threaded lower end 156 of the rod 46.

The rod 46 extends through the graphite fitting 42 that caps off the upper arm 38 of the glass chamber 32. This fitting 42 has a cylindrical exterior, and into its lower end is reamed a tapered region 160 considerably greater in diameter than the rod 46 for mating with the ground glass exterior of the upper arm 38 of the glass chamber 32. From there, the interior region narrows to a constricted neck 162 having a diameter matched to that of the rod 46 so that the rod fits closely as it extends therethrough.

It is preferred to coat each susceptor plate 10 twice, the second time with the plate positioned in the inverted vertical position. During the second coating, the uncoated portion, previously held by the clamp 48, is coated. The second coating also helps to equalize the coating over the length of the plate 10 because in each coating, a slightly heavier coating occurs at the lower end, and the thickness of the coating that is deposited decreases upwards as the coating vapor becomes depleted from the gas stream progressively upwards in the chamber.

Typical coating conditions for coating a susceptor plate 10 with silicon carbide are as follows. The chamber 28 contains particles 72 of zirconium oxide coated with pyrocarbon. Sufficient particles are present within the chamber to form a fluidized bed that extends to well above the susceptor plate. For a susceptor plate 39 cm long, this requires about 40 g of particles per cm$^2$ of cross-sectional area. The particle size and particle density is sufficient to provide a surface area (cm$^2$) to volume (cm$^3$) ratio of about 50:1. The carrier gas is hydrogen and its flow rate is adjusted to about 600 cc/min per cm$^2$ of cross-sectional area to produce a very active fluidized bed of particles. Methyl trichlorosilane (CH$_3$SiCl$_3$)$_2$, introduced at a flow rate of about 0.1 gm/min per cm$^2$ of cross-sectional area, decomposes to produce smooth, high-density silicon carbide. The process is continued for about 240 min until a coating layer about 0.1 mm thick forms at the lower end of the receptor plate. Then the chamber 28 is allowed to cool, the plate inverted in the clamp 48, and the process repeated.

Another application of the invention is to coat fusion limiter (armor) tiles which are graphite plates. A tile having cross-sectional dimensions of 30 cm×6.3 cm is coated in a chamber portion 26 having cross-sectional dimensions of 33 cm×8.9 cm. The coating is silicon-alloyed pyrolytic carbon, having a silicon to carbon atom ratio of about 1:50. The coating temperature is adjusted to 1350° C. A sufficient particle charge (about 40 g per cm$^2$ of cross-sectional area) is provided to make a fluidized bed that is well above the tile being coated. The carrier gas is argon which is introduced at a rate of about 350 cc/min per cm$^2$ of cross-sectional area, producing a very active fluidized bed of particles. Propylene and methyl trichlorosilane are introduced together at rates of 80 cc/min and 0.3 g/min per cm$^2$ of cross-sectional area, respectively. Deposition occurs under these conditions at rates of about 0.3 g/min per cm$^2$.

The invention is best appreciated in terms of its reduction in breakage rate. Whereas breakage frequently occurred in circular coating chambers, breakage of susceptor plates in rectangular coating chambers according to the invention never occurred. The cross-sectional area is reduced to about one third of that of a cylindrical chamber which would be needed to accommodate the same size article, and the required particle charge, carrier gas and coating vapor are correspondingly reduced.

While the invention has been described in terms of a certain preferred embodiment, modifications obvious to one with ordinary skill in the art may be made without departing from the scope of the invention. For example, a tile may be formed having an arcuate cross section, in which case, the portion of the chamber where the tile is coated has a similar arcuate cross section. For coating a thin tubular object, a cylindrical rod might be inserted axially within a cylindrical coating chamber, providing a narrow annular coating region.

Various features of the invention are set forth in the following claims.

What is claimed is:

1. A method for using chemical vapor deposition to coat a large article having a pair of faces and which is relatively thin between said faces so that the object is subject to breakage in the presence of surging particles, the method comprising Providing a vertical coating chamber having a pair of opposed endwalls and a pair of opposed vertical sidewalls which are configured to generally parallel the faces of the article when the article is centered between said sidewalls, said sidewalls having a horizontal dimension between about 2 and about 10 times the horizontal dimension of said endwall, suspending said article within said chamber with said faces centered between said sidewalls, charging said chamber with particulate material to provide an appropriate surface to volume ratio within said chamber, flowing a carrier gas upwardly through said chamber at a rate sufficient to fluidize said charge of particulate material, creating a fluidized bed extending above the suspended article, mixing suitable vapors with said carrier gas, and heating said chamber to a temperature whereat chemical reactions produce a coating on the suspended article.

2. A method according to claim 1, suspending said article within said chamber only by its upper end.

3. A method according to claim 2, suspending said article by its upper end, coating the article, resuspending the article by its opposite end, and recoating the article.

4. A method according to claim 1 providing a chamber matched to said article so that parallel faces of said article are spaced from said sidewalls between about 1 cm and about 5 cm.

5. A method according to claim 1 providing a chamber matched to said article so that lateral edges of the article are spaced from said endwalls between about 1 cm and about 5 cm.

6. A method according to claim 1 providing a chamber having a generally rectangular horizontal cross section and coating an article having a generally rectangular horizontal cross section therein.

7. A method according to claim 1 providing a chamber having a horizontal cross-sectional area between about 5 and about 10 times the horizontal cross-sectional area of the article.

8. A method according to claim 1 wherein said vapor is selected to decompose to coat said article with carbon, silicon and mixtures thereof.

* * * * *